United States Patent [19]

Togashi et al.

[11] Patent Number: 5,078,186
[45] Date of Patent: Jan. 7, 1992

[54] LEAD FORMING FOR ELECTRONIC PARTS HAVING GULL WING TYPE OUTER LEADS

[75] Inventors: Minoru Togashi, Chigasaki; Mitsuo Mori; Katsuyoshi Inoue, both of Yokohama; Nobuhiro Furudate, Iwate, all of Japan

[73] Assignee: Kabushiki Kaisha Toshiba, Kawasaki, Japan

[21] Appl. No.: 588,130

[22] Filed: Sep. 26, 1990

[30] Foreign Application Priority Data

Sep. 28, 1989 [JP] Japan ................................. 1-253651
Dec. 20, 1989 [JP] Japan ................................. 1-330136

[51] Int. Cl.⁵ .............................................. B21F 45/00
[52] U.S. Cl. ..................................... 140/105; 72/313
[58] Field of Search ........................... 140/105; 72/313

[56] References Cited

U.S. PATENT DOCUMENTS 4,907,628 3/1990 Corey et al. ........................ 140/105
4,957,146 9/1990 Satterfield et al. ................. 140/105

*Primary Examiner*—Lowell A. Larson
*Attorney, Agent, or Firm*—Finnegan, Henderson, Farabow, Garrett, and Dunner

[57] ABSTRACT

For improving both coplanarity and bending accuracy of gull wing type outer leads of electronic parts such as resin molded semiconductor devices, quad flat packages, etc., a lead forming machine is used which incudes a bending die and a stripper which have a pair of faced projections at both sides thereof, and bending punches vertically moving through perforations of the stripper. An electronic part with gull wing type outer leads is disposed between the bending die and the stripper in such a manner that the outer leads extend horizontally from the projections of the bending die. In this case, both sides of outer leads are placed on projections of the bending die without clamping them with the faced projections of the bending die and the stripper. The bending punches are depressed through perforations of the stripper to perform primary lead forming for the outer leads. Thereafter, the bending punches are further depressed to carry out secondary lead forming for the outer leads, while clamping flat portions of outer leads with the faced projections.

15 Claims, 6 Drawing Sheets

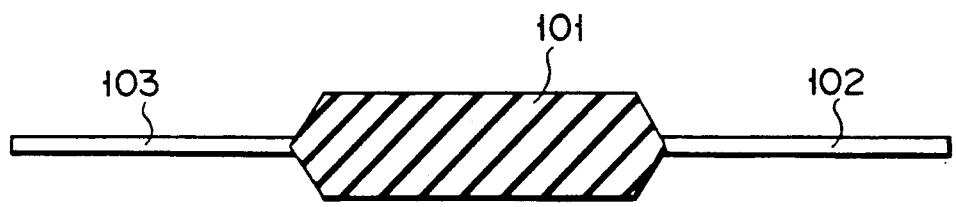
F I G. 1A
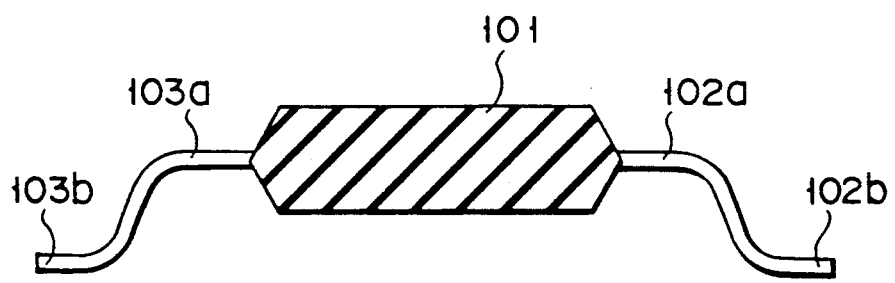
F I G. 1B

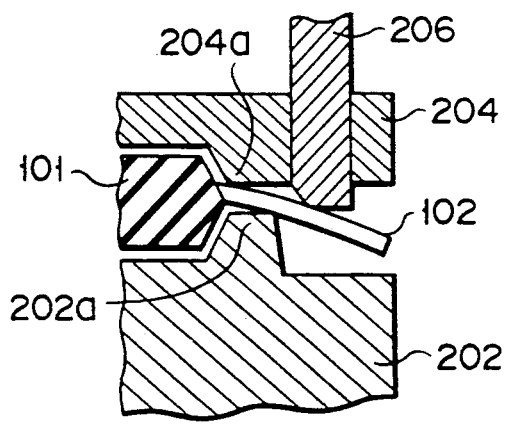
F I G. 6A
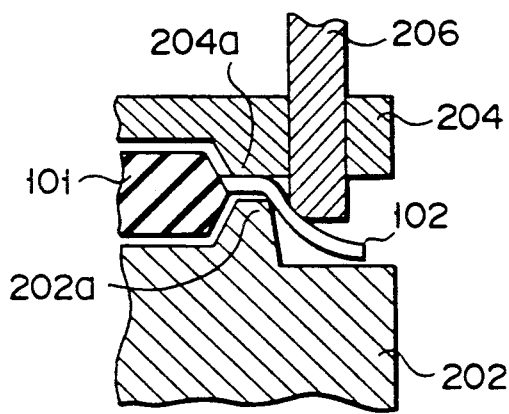
F I G. 6B
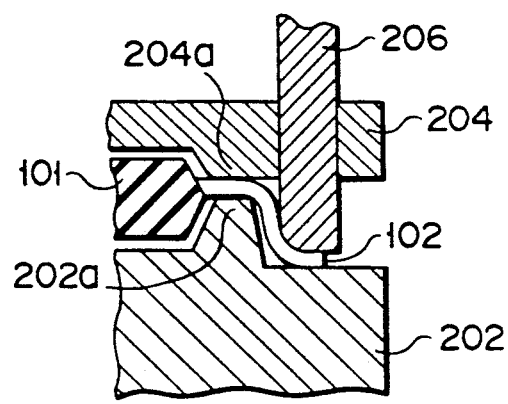
F I G. 6C

LEAD FORMING FOR ELECTRONIC PARTS HAVING GULL WING TYPE OUTER LEADS

BACKGROUND OF THE INVENTION

1. Field of the Invention

The present invention relates to a method of forming outer leads of electronic parts such as resin molded semiconductor devices, and QFPs (Quad Flat Packages) and SOPs (Small Outline Packages) including at least one semiconductor chip, and a lead forming machine therefor.

2. Description of the Related Art

For mounting electronic parts, such as resin molded semiconductor devices, and QFPs and SOPs including a semiconductor chip, on a circuit board such as printed circuit boards, after solder pellets are previously provided on the board by a printer, outer leads of the electronic parts are in contact with the solder pellets. In this state, the circuit board is supplied to a heating furnace to carry out soldering of the electronic parts by a reflow system.

As shown in FIG. 1A, the surface mounting type electronic part 101 includes at least one outer lead 102 or 103 almost horizontally extending from both side surfaces of the resin layer (or package) thereof. As shown in FIG. 1B, these leads include flat portions 102a and 103a with a predetermined length located near the roots thereof, and flat portions 102b and 103b to be soldered to the circuit board. For example, the flat portions 102a and 102b are provided by clockwise bending the outer lead 102, extending from the side of the resin layer (or package) of the electronic part 101, to approximately 90° except for a part of the root, and by counterclockwise bending a part of the bent outer lead to approximately 90°.

FIG. 2 is a sectional view showing a main part of a conventional lead forming machine 200. The forming machine 200 comprises a fixed unit held by a die holder 203 and including a bending die 202 fixed on a bolster 201, a semi-movable unit including a stripper 204 held by a stripper holder 205, and a movable unit which includes first and second plate-like bending punches 206 and 207, which can be vertically moved through a perforation provided in the stripper 204, thereby forming leads 102 and 103 of the electronic part 101 arranged in a space rendered by the bending die 202 and the stripper 204, a punch holder 208 and a spacer 210 holding these bending punches and fixed on a backup plate 213, a support block 209 attached to the spacer and arranged to have a predetermined distance from the upper surface of the stripper 204, and an upper holder 214 for supporting the backup plate 213 and holding the stripper holder 205 through a spring member 212 having a high elastic force.

The bending die 202 and the stripper 204 for placing the electronic part 101 have first projections 202a and 202b and second projections 204a and 204b which are faced each other and clamp the leads 102 and 103 near their roots. In a state wherein the lead formation is completed, the lower surface of the support block 209 contacts the upper surface of the stripper 204 to control a movement of the first and second bending punches 206 and 207. The lead forming machine 200 is provided with an alignment pin 215 for setting the electronic part 101 at a predetermined position in the bending die and stripper, and a knockout pin 216 for taking out the electronic part from the predetermined position. In addition, stopper plates 211 are provided to the first and second bending punches 206 and 207.

Using the lead forming machine 200 shown in FIG. 2, a process for forming the outer lead 102 of the electronic part 101 will be described below with reference to FIGS. 3A to 3C. (Note that the outer lead 103 is omitted for the sake of illustrative convenience).

As shown in FIG. 3A, when the movable unit having the first and second bending punches 206 and 207 is moved downward, the lead 102 of the electronic part 101 arranged in the space between the bending die 202 and the stripper 204 is strongly clamped between the first projections 202a and 204a, which are faced each other near the root of the lead 102, by a high reaction force of the spring member 202 located between the stripper holder 205 and the upper holder 214.

As shown in FIG. 3B, when the movable unit is further moved downward, the clamped lead 102 is clockwise bent to approximately 90° by the first bending punch 206 to form a flat portion 102a near the root thereof, thereby performing primary lead forming.

As shown in FIG. 3C, when the movable unit is further moved downward, the lead 102 is counterclockwise bend to approximately 90° by the first bending punch 206 to form a flat portion 102b of the lead, thereby performing secondary lead forming. Thus, the conventional lead forming process is completed.

As shown in FIG. 4A, however, in the outer leads 102 and 103 horizontally extending from both side surfaces of the resin-molded electronic part 101, its coplanarity is not always uniform because unwanted flashes or burrs are caused on the resin layer during the resin molding, the caused flashes are removed therefrom, or the resin layer expands or contracts due to heat. Therefore, unwanted deformation will be caused in the outer leads. That is, in FIG. 4A, the lead 102 which is bent to a right-upward direction and the lead 103 which is bend to a left-downward direction are shown. In addition, in the conventional lead forming, the primary lead forming is performed while the roots of the outer leads 102 and 103 are strongly clamped, and the flat portions 102b and 103b to be soldered to the circuit board are subsequently formed in the secondary lead forming. Therefore, since the deformation of the flat portions 102a and 103a especially near its roots will not be changed before and after the forming process, it cannot be controlled.

That is, as shown in FIG. 4B, since "spring back" of each lead occurs within the elastic deformation, the unwanted deformation of the outer leads prior to the lead forming process is still remained, so that the coplanarity of the leads to be soldered is not improved. Accordingly, a highly reliable lead forming cannot be provided.

SUMMARY OF THE INVENTION

It is, therefore, an object of the present invention to provide a method of forming gull wing type outer leads of an electronic part for improving both accuracy of coplanarity and a bent configuration thereof.

It is another object of the present invention to provide a method of forming gull wing type outer leads of an electronic part capable of improving a reliability of surface mounting thereof.

It is still another object of the present invention to provide a machine for forming gull wing type outer leads of an electronic part for improving both accuracy of coplanarity and a bent configuration thereof.

According to an aspect of the present invention, there is prepared a lead forming machine which includes a bending die and a stripper each having projections opposite to each other at both sides, and bending punches which move vertically through perforations provided adjacently to the projections of the stripper. The electronic part is arranged in the bending die so that gull wing type outer leads extend horizontally from the faced projections, and the outer leads are placed on the projections of the bending die without clamping them with faced projections so that a desired clearance or gap is provided between the outer leads and the projections of the stripper. Thereafter, in this state, the bending punches are moved down through the perforations of the stripper to perform a primary lead forming of the outer leads. While clamping the outer leads with the faced projections, the bending punches are further moved down to perform a secondary lead forming.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings, in which:

FIG. 1A is a sectional view showing a surface-mounting electronic part having gull wing type outer leads to perform a lead forming;

FIG. 1B is a sectional view showing a surface-mounting electronic part subjected to the lead forming;

FIGS. 6A to 6C are sectional views showing a lead forming process according to the present invention using the lead forming machine in FIG. 5.

DETAILED DESCRIPTION OF THE PREFERRED EMBODIMENTS

A lead forming machine and a lead forming method according to the embodiments of the present invention will be described with reference to FIG. 5 and FIGS. 6A to 6C.

Figure 2:
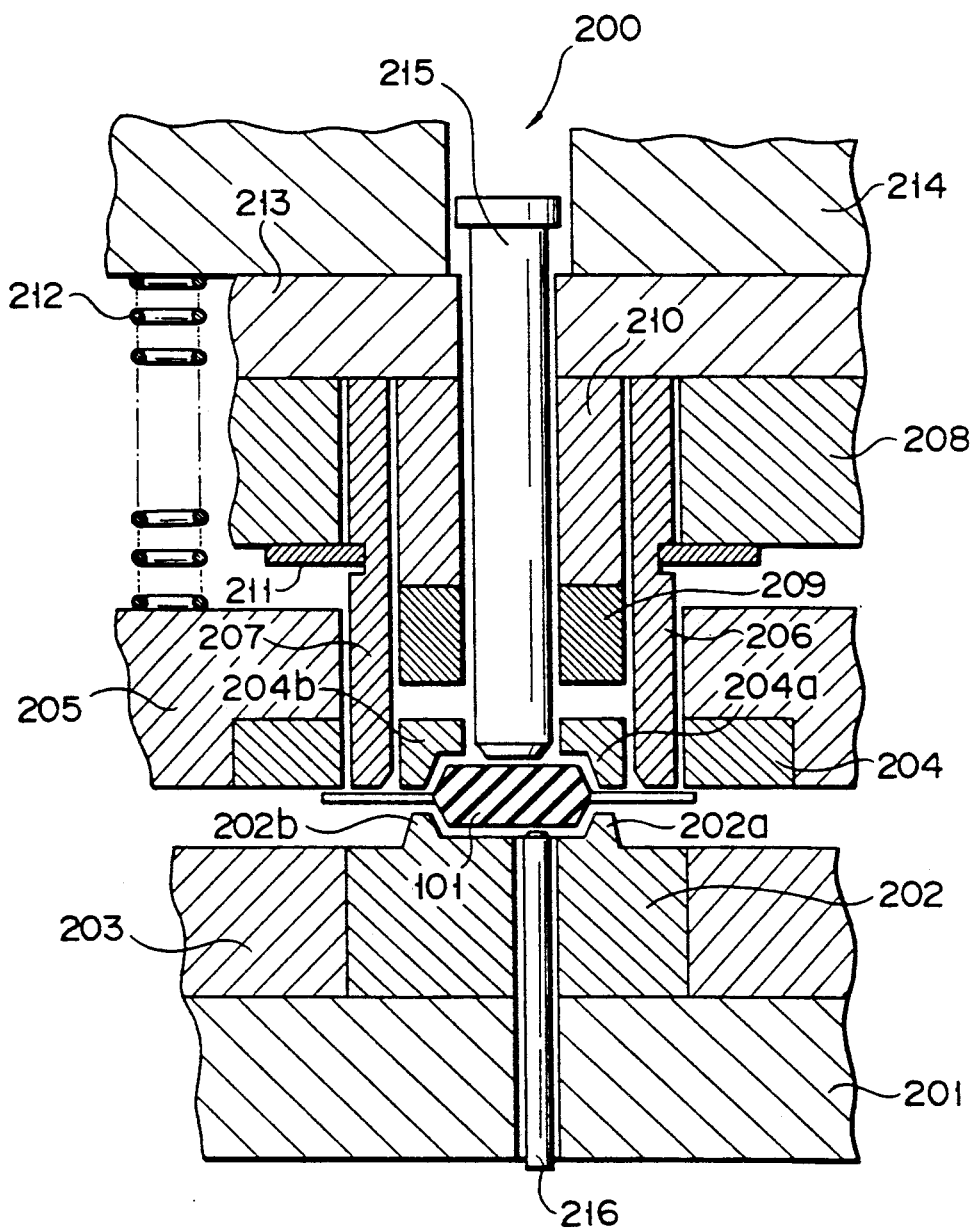
FIG. 2 is a sectional view schematically showing a conventional lead forming machine.
Figure 3A:
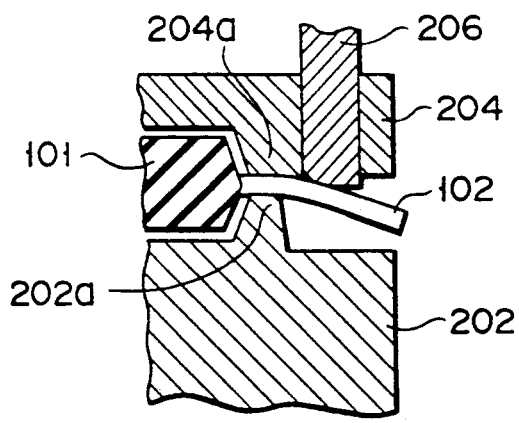
FIGS. 3A to 3C are sectional views showing a conventional lead forming process using the lead forming machine in FIG. 2.
Figure 3B:
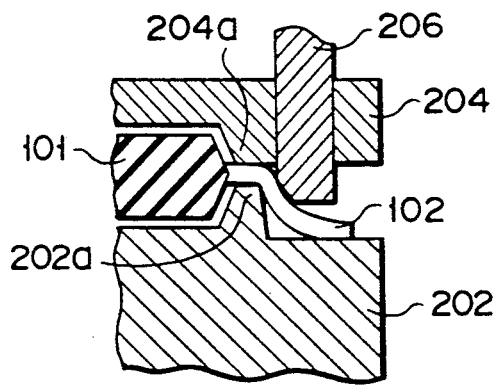
Figure 3C:
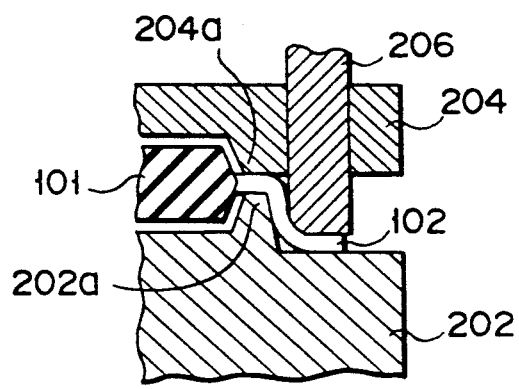
Figure 4A:
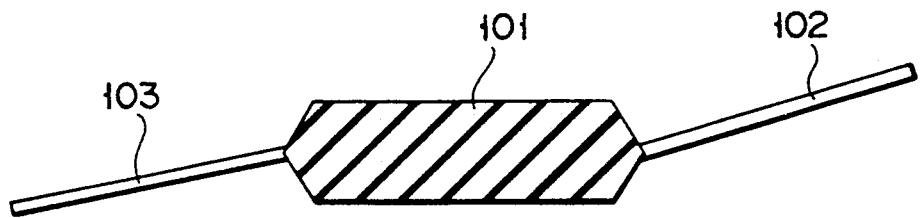
FIG. 4A is a sectional view showing a surface-mounting electronic part having gull wing type outer leads with unwanted deformation.
Figure 4B:
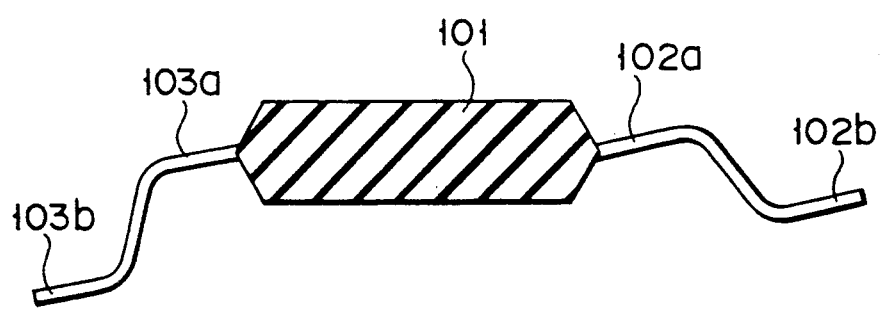
FIG. 4B is a sectional view showing a surface-mounting electronic part having gull wing type outer leads with unwanted deformation subjected to the lead forming.
Figure 5:
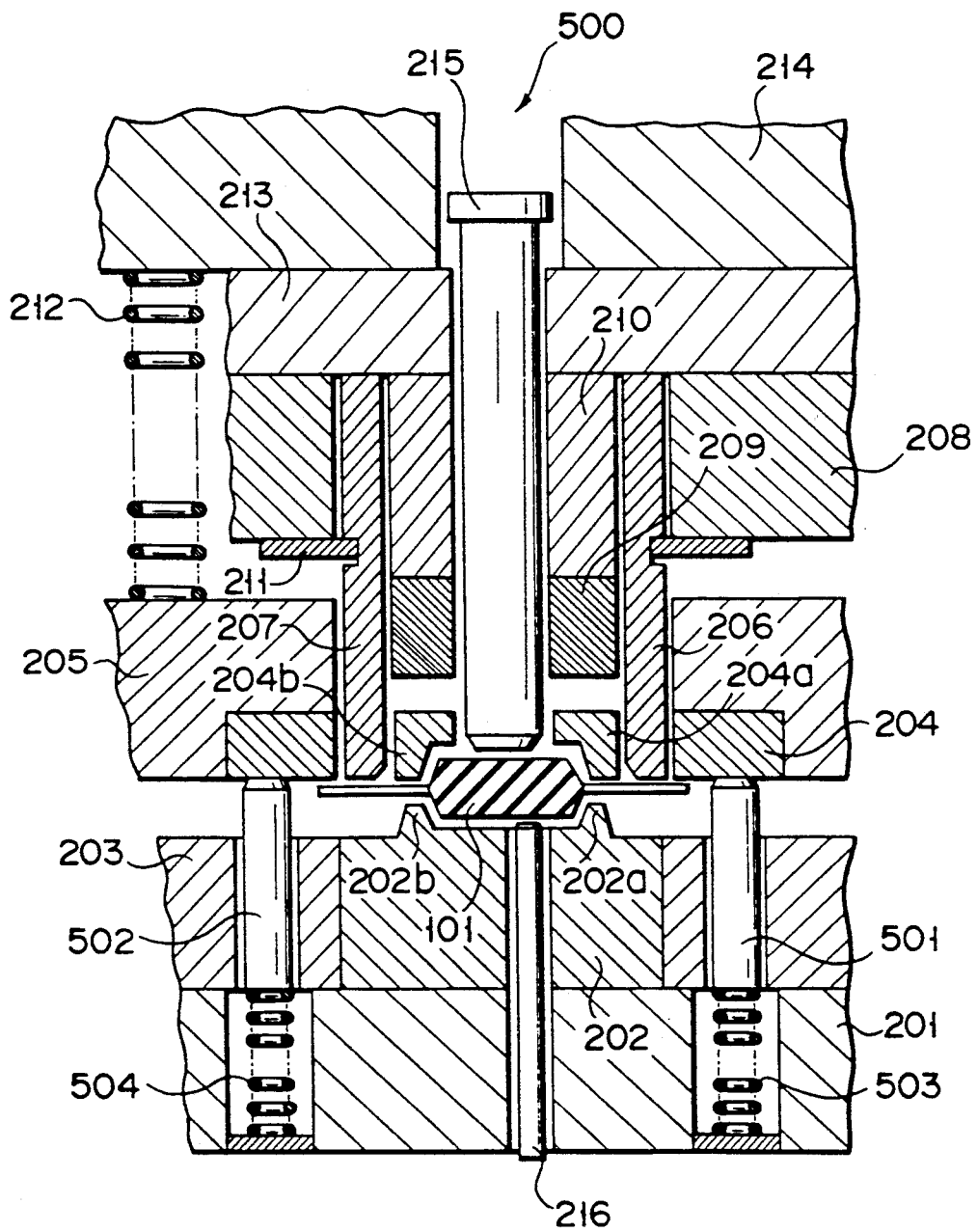
FIG. 5 is a sectional view schematically showing a lead forming machine according to the present invention.

A lead forming machine 500 shown in FIG. 5 is basically similar to the conventional one. Stripper lift pins 501 and 502 energized by spring members 503 and 504 are attached to the die holder 203 to energize the stripper 204 upward. With the above means, a desired gap is provided between an upper surface of the lead 102 and the first projection 204a of the stripper and between an upper surface of the lead 103 and the second projection 204b of the stripper during the primary lead forming of the leads 102 and 103 of the electronic part 101. Therefore, the leads will not be clamped. In this case, an elastic force of the spring members 503 and 504 is higher than that of the spring member 212.

If, in place of the lift pins energized by the spring members, a spring member having a low elastic force is used as the spring member 212, the clamping force may be reduced during the primary lead forming of the leads 102 and 103.

Using the lead forming machine 500 shown in FIG. 5, a process of forming the outer lead 102 of the electronic part 101 will be described below with reference to FIGS. 6A to 6C. (Note that the outer lead 103 is omitted for the sake of illustrative convenience).

As shown in FIG. 6A, when the movable unit having first and second bending punches 206 and 207 is moved downward, a gap is provided between the first projection 202a of the bending die and the first projection 204a of the stripper which are faced each other near the root of the lead 102, since the stripper 204 is upward energized by the lift pins 501 and 502 energized by the spring members 503 and 504, opposing to the elastic force of the spring member 212. Therefore, the lead 102 of the electronic part 101 arranged in the space between the bending die 202 and the stripper 204 is not clamped. In this state, the lead 102 is supported on the first projection 202a of the bending die 202, and the right-upward deformation of the lead is somewhat corrected by the first punch 206.

As shown in FIG. 6B, when the movable unit is further moved downward, the lead 102 of the electronic part is clockwise bent to approximately 90° by the first punch 206 without clamping it, and the right-upward deformation of the lead is further corrected. At the same time, a flat portion 102a is formed near the root of the lead. Thus, the primary lead forming is performed.

As shown in FIG. 6C, when the movable unit is further moved downward, the lower surface of the support block 209 contacts the upper surface of the stripper 204. At this time, the flat portion 102a of the lead is clamped between the first projection 202a of the bending die 202 and the first projection 204a of the stripper 204, and the lead 102 is counterclockwise bent to approximately 90° by the first punch 206 to provide a flat portion 102b of the lead, thus performing the secondary lead forming. In this step, the root of the lead is subjected to plastic deformation to correct the unwanted deformation of the lead. In addition, the coplanarity of the flat portion 102b is improved.

As described above, according to the present invention, since the unwanted deformation of the outer leads of electronic parts, caused during the manufacture including the resin molding process, can be eliminated, the coplanarity of the leads and the accuracy of the bent configuration thereof will be improved, and it will be reliably possible to mount the electronic parts on circuit boards.

It is further understood by those skilled in the art that the foregoing description is a preferred embodiment of the disclosed device and that various changes and modifications may be made in the invention without departing from the spirit and scope thereof.

What is claimed is:

1. A method of forming gull wing type outer leads of an electronic part comprising the steps of:

preparing a lead forming machine including a bending die and a stripper each having a projection at both sides thereof, said projections of said bending die facing those of said stripper, said stripper having perforations located near said projections thereof, and bending punches vertically moving through said perforations of said stripper;

disposing an electronic part with gull wing type outer leads between said bending die and said stripper so that said outer leads extend horizontally from both sides of said projections of said bending die, said outer leads being placed on said projections of said bending die without clamping them therewith to provide a desired clearance between said outer leads and said projections of said stripper;

depressing said bending punches through said perforations of said stripper without clamping said outer leads with said projections of said bending die and said stripper to perform primary lead forming for said outer leads; and further depressing said bending punches through said perforations of said stripper to carry out secondary lead forming for said outer leads, while clamping said outer leads with said projections of said bending die and said stripper.

2. The method of forming gull wing type outer leads of an electronic part according to claim 1, wherein said projections of said stripper are slightly spaced apart from upper surfaces of said outer leads.

3. The method of forming gull wing type outer leads of an electronic part according to claim 1, wherein said electronic part with gull wing type outer leads is comprised of resin molded semiconductor devices.

4. The method of forming gull wing type outer leads of an electronic part according to claim 1, wherein said electronic part with gull wing type outer leads is comprised of quad flat packages.

5. The method of forming gull wing type outer leads of an electronic part according to claim 1, wherein said electronic part with gull wing type outer leads is comprised of small outline packages.

6. The method of forming gull wing type outer leads of an electronic part according to claim 1, wherein a width of said projections of said bending die determines a width of a flat portion in each of said outer leads near roots thereof.

7. The method of forming gull wing type outer leads of an electronic part according to claim 6, wherein said secondary lead forming for said outer leads renders plastic deformation to said roots of said outer leads.

8. The method of forming gull wing type outer leads of an electronic part according to claim 1, wherein the step of said primary lead forming for said outer leads includes the sub-step of:

bending each of said outer leads downwardly without clamping them, to form a first lead segment having an angle of approximately 90° with respect to said electronic part.

9. The method of forming gull wing type outer leads of an electronic part according to claim 8, wherein the sub-step of said secondary lead forming for said outer leads includes the step of:

for each of said outer leads, bending a portion of said first lead segment outwardly to form an approximately horizontal second lead segment, while clamping each of said outer leads.

10. A lead forming machine for an electronic part having gull wing type outer leads, comprising:

a fixed unit including a bending die, said bending die having a first projection at both sides thereof to support said outer leads;

a semi-movable unit including a stripper, said stripper having a second projection at both sides thereof, said second projections facing said first projections, respectively, said stripper having perforations near said projections;

a movable unit including bending punches for moving through said perforations of said stripper; and means for controlling a clamping force for said outer leads, said means for controlling a clamping force for said outer leads including first spring members with a low elastic force provided between said semi-movable unit and said movable unit, and lift pins energized by second spring members with a high elastic force, said lift pins being arranged in said movable unit, said lift pins pressing against said stripper, and opposing said elastic force of said first spring members.

11. The lead forming machine according to claim 10, wherein said movable unit includes a punch holder for holding said bending punches, and a support block for depressing said stripper.

12. The lead forming machine according to claim 10, wherein each of said bending punches has a plate-shaped configuration.

13. The lead forming machine according to claim 10, wherein said semi-movable unit includes a stripper holder for holding said stripper.

14. The lead forming machine according to claim 10, wherein an alignment pin is provided to align said electronic part in a space rendered by said bending die and said stripper.

15. The lead forming machine according to claim 14, wherein said fixed unit includes a knockout pin for taking said electronic part from said space.

* * * * *